United States Patent [19]

Wakino et al.

[11] Patent Number: 4,595,515
[45] Date of Patent: Jun. 17, 1986

[54] VIBRATION-ISOLATING ARTICLE

[75] Inventors: Kikuo Wakino; Michihiro Murata; Shunjiro Imagawa, all of Nagaokakyo, Japan

[73] Assignee: Murata Manufacturing Co., Ltd., Japan

[21] Appl. No.: 644,978

[22] Filed: Aug. 28, 1984

[30] Foreign Application Priority Data

Aug. 30, 1983 [JP] Japan .................................. 58-159323

[51] Int. Cl.$^4$ ........................... E04B 1/74; F16F 7/00; H01L 41/04; H01L 41/18

[52] U.S. Cl. .................................... 252/62; 252/62.9; 252/500; 252/507; 252/511; 252/512; 252/513; 252/520; 252/521; 310/326; 310/327; 310/340

[58] Field of Search ................ 252/62, 62.9, 500, 507, 252/511, 512, 513, 520, 521; 310/326, 327, 340

[56] References Cited

U.S. PATENT DOCUMENTS

| | | | |
|---|---|---|---|
| 2,420,864 | 5/1947 | Chilowsky | 252/62.9 |
| 2,443,471 | 6/1948 | Mason | 310/326 |
| 3,179,823 | 4/1965 | Nesh | 310/326 |
| 3,943,387 | 3/1976 | Veith | 29/25.35 |
| 4,104,920 | 8/1978 | Albert | 73/517 AV |

FOREIGN PATENT DOCUMENTS

| | | | |
|---|---|---|---|
| 51-7498 | 1/1976 | Japan | 252/62.9 |
| 51-23698 | 2/1976 | Japan | 252/62.9 |
| 51-30391 | 3/1976 | Japan | 252/62.9 |
| 51-36597 | 3/1976 | Japan | 252/62.9 |
| 57-202789 | 11/1982 | Japan | 252/62.9 |

*Primary Examiner*—Dennis L. Albrecht
*Attorney, Agent, or Firm*—Ostrolenk, Faber, Gerb & Soffen

[57] ABSTRACT

A vibration-isolating article is composed of a composite material comprising a powdered piezoelectric material and a high polymer, said composite material having electrical leakage paths. The electrical leakage paths may be formed by an electrically conductive powdered material incorporated into the composite material, or the powdered piezoelectric material per se, or a matrix of the high polymer.

5 Claims, 9 Drawing Figures

VIBRATION-ISOLATING ARTICLE

This invention relates to a vibration-isolating article having excellent vibration-insulating properties.

Recently, noises and vibrations have been developed into a great social problem awaiting a solution. In processing operations which require a high precision of the order of several microns or less, there have been used precise processing apparatus such as optical instruments, laser devices and the like. Such precise apparatus are considerably affected by noises and vibrations, so that the quality of the processed products are greatly influenced by the vibrations. Also, even in consumer's goods comprising a rotating machinery or a loudspeaker system, such as, for example, video tape recorders, stereo phonographs and the like, vibrations have a great influencies on their characteristics. It is therefore required to reduce the influences of the vibrations and noises. To minimize the influences of the vibrations and noises on characteristics of the precise apparatus, it has been proposed to improve the stiffness properties of devices which become a source of vibrations. Also, it has been proposed to provide means for preventing the growth of sympathetic vibrations, or a vibration-isolating system. However, it is not possible to reduce the influence of vibrations and noises as small as required.

It has been investigated to use a vibration-isolating article which damps vibrations or noises. For example, vibration-isolating plates have been used to support the source of vibrations such as rotating machinery on a chasses, a base or a floor. In order to reduce transmission of vibrations from the source to the exterior, the vibration-isolating article is theoretically required to be large in mass, energy loss ratio of vibration transmission, logarithmic decrement and elastic module. Additionally, the vibration-isolating article is required to have no influence on the characteristics of the devices.

Conventionally known vibration-isolating articles are generally made of vibration-isolating materials such as rubbers, vibrationproof metal alloys and ferrite composite materials. Such vibration-isolating materials can be used for specific purposes, but cannot be used for general purposes. They satisfy some of the aforesaid requirements, but none of them satisfy all the requirements. For example, the rubber vibration isolators are large in logarithmic decrement but small in elastic module and Young's module. Contrary to this, the vibrationproof metal alloys are very large in Young's module but small in logarithmic decrement. The ferrite composite materials are large in both the logarithmic decrement and Young's module, but they cannot be accepted as a material for use in very high precise apparatus. Because, the ferrite composite material is magnetized with orientation because of a ferromagnetic material contained therein, so that vibration-isolating articles made of such ferrite composite material would cause magnetic flux which has a considerable influence on the properties of the precise apparatus.

SUMMARY OF THE INVENTION

It is therefore an object of the present invention to provide an improved vibration-isolating article which overcomes the aforesaid disadvantages.

Another object of the present invention is to provide a vibration-isolating article having a large mass, a large logarithmic decrement and a large elastic module.

Further object of the present invention is to provide a vibration-isolating article which may have any desired properties suitable for its particular use, such as mass, logarithmic decrement and elastic module.

According to the present invention these and other objects are solved by providing a vibration-isolating article composed of a composite material comprising a powdered piezoelectric material and a high polymer, said composite material being provided with electrical leakage paths therein.

The vibration-isolating article of the present invention may be employed in any form, for example, in a form of a plate, a box, a cylinder, or a tube, etc.

As a powdered piezoelectric material for use in the present invention, there may be used those such as powdered piezoelectric high polymers including polyvinylidene fluorides and trifluoroethylene-polyvinyl difluoride (PVDF) copolymers, and powdered inorganic piezoelectric materials. The inorganic piezoelectric materials include, without being limited to, modified $PbTiO_3$ system solid solutions, modified solid solutions of a binary or ternary system of $Pb(Ti,Zr)O_3$, modified $LiNbO_3$ system solid solutions, modified $LiTaO_3$ system solid solutions, and modified $BaTiO_3$ system solid solutions. These powdered piezoelectric materials may be used alone or in combination.

As a high polymer for use in the present invention as a matrix of the composite material, there may be used those such as natural rubbers, synthetic rubbers, thermoplastic resins and thermosetting resins. The synthetic rubbers include, without being limited to, fluororubbers, silicone rubbers, butyl rubbers, butadiene rubbers, ethylene-vinyl acetate copolymers, and thermoplastic elastomers. The thermoplastic elastomers include, without being limited to, thermoplastic polyurethane elastomer and stylene-butadiene block polymers. Additionally, the high polymer may be a piezoelectric high polymer as mentioned above.

The thermoplastic resins include, without being limited to, polyethlene, polypropylene, polyvinyl chloride, polystylene, acrylic resins, polyamides, polycarbonates, polyacetal, polyphenylene oxides, saturated polyesters, cellulose acetate, polyvinyl acetates, fluoroplastics, vynylidene fluoride resins, vinylidene chloride resins, ionomers, poly-4-methyl-1-pentene, polyphenylene sulfides, and polyallylates.

The thermosetting resins include, without being limited to, polyimide resins, polyamide-imide resins, polyurethane, silicone resins, allyl resins, epoxy resins, unsaturated polyesters, amino resins and phenolic resins.

According to the present invention, the vibration-isolating article is provided with the electrical leakage paths through which electrical charges produced by the piezoelectric effect can flow. Such electrical leakage paths may be formed in the following four procedures:

Firstly, the electrical leakage paths are formed by a powdered electrically-conductive material dispered in the composite material composed of a powdered piezoelectric material and a matrix of the high polymer. As a electrically-conductive material, there may be used those such as fine carbon substances which includes carbon black, graphite powder, and fine carbon fibers; metals; semiconducting inorganic materials such as $SnO_2$ and $ZnO$; fine powders coated with an electrically-conductive material, of an insulating high polymer or of an insulating inorganic material. The high polymer used as the matrix of the composite material may be a piezoelectric material as mentioned above.

Secondary, the electrical leakage paths may be formed by the powdered piezoelectric material of which particles have electrically-conductive coatings provided on surfaces thereof. In this case, the powdered piezoelectric material is dispersed in the high polymer matrix so that contact is made between adjacent particles thereof. The electrically-conductive coatings may be made from any of the conductive materials such as metals by electroless plating, vacuum deposition, sputtering and the like.

Thirdly, the electrical leakage paths may be formed by powder of a piezoelectric material having semiconductivity. Such a piezoelectric material with the semiconductivity, i.e., a semiconducting piezoelectric material may be prepared by firing the aforesaid inorganic piezoelectric materials in a neutral or reducing atmosphere. Also, such a semiconducting piezoelectric material may be prepared even by incorporating one or more semiconducting agents into a composition of the inorganic piezoelectric materials. The semiconducting agents include trivalent elements and pentavalent elements. The powdered semiconducting piezoelectric material is dispersed in the matrix of the high polymer so that contact is made between adjacent particles of the powdered semiconducting piezoelectric material.

Lastly, the electrical leakage paths may be formed by using a semiconducting high polymer as a material for the matrix. In this case, the powdered piezoelectric material is dispersed in the matrix of the semiconducting high polymer so that electrical charges generated therein can flow through the matrix to the exterior.

A preferred vibration-isolating article of the present invention is composed of a composite material comprising, by weight, 60 to 99% of the powdered piezoelectric material and 1 to 40% of the high polymer. Because, the greater the content of the powdered piezoelectric material the greater the specific gravity and logarithmic decrement. However, if the content of the powdered piezoelectric material exceeds 99% or if the content of the high polymer is less than 1%, it causes a considerable decrease of the mechanical strength. The greater the content of the high polymer the greater the elastic modele and mechanical strength. However, if the content of the high polymer exceeds 40% or if the content of the powdered piezoelectric material is less than 60%, it causes a considerable decrease of the logarithmic decrement.

When a powdered electrically-conductive material is employed to form the electrical leakage paths in the vibration-isolating article, it is preferred to incorporate the same into the composite material in an amount of 0.1 to 10% by weight with respect to the amount of the composite material. Because, if the content of the electrically-conductive material is less than 0.1% by weight, it is not possible to form the electrical leakage paths. If the content of the electrically-conductive material exceeds 10% by weight, it causes a decrease of the logarithmic decrement.

When using the vibration-isolating article made of the composite material according to the present invention, the vibration energy applied to the vibration-isolating article is converted into electrical energy, i.e., electrical charges, by the piezoelectric effect of the powdered piezoelectric material, and the produced electrical charges are in turn converted into heat energy while flowing through the electrical leakage paths. Accordingly, the vibration energy is finally converted to heat energy and consumed as heat, thus making it possible to improve the logarithmic decrement.

The invention will be further apparent from the following description taken in conjunction with the accompanying drawings and the preferred embodiments thereof.

BRIEF EXPLANATION OF THE DRAWINGS

Referring now to FIG. 1, there is shown one embodiment of the present invention in which a vibration-isolating article is composed of a composite material including a powdered piezoelectric material 1, a high polymer 2, and a powdered electrically-conductive material 3. The powder of the conductive material is dispersed in the matrix of the high polymer together with the powdered piezoelectric material so that electrical contact is made between adjacent particles of the piezoelectric material and the conductive material to form electrical leakage paths. If vibrations are applied to the vibration-isolating article, electrical charges are produced in the particles of the piezoelectric material by the piezoelectric effect and can flow through the electrical leakage paths from the vibration-isolating article to the other conductive media adjacent thereto.

FIG. 2 shows another embodiment of the present invention in which a vibration-isolating article is composed of a composite material consisting essentially of a powdered piezoelectric material 1 and a high polymer 2. The particles of the powdered piezoelectric material are coated with an electrically-conductive material to form conductive coatings 4 on their particle surfaces and are dispersed in the matrix of the high polymer 2 so that contact is made between adjacent particles of the powdered piezoelectric material to form electrical leakage paths.

Figure 1:
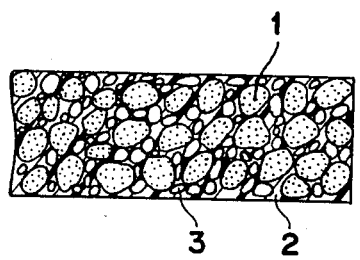
FIGS. 1 to 4 are diagrammatic views showing various microstructures of vibration-isolating articles according to the present invention.
Figure 2:
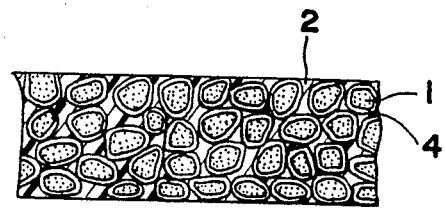
Figure 3:
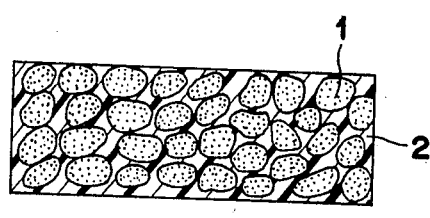

A vibration-isolating article shown in FIG. 3 is composed of a composite material consisting essentially of a powdered semiconducting piezoelectric material 1 and a high polymer 2. The powdered semiconducting piezoelectric material 1 is dispersed in the matrix of the high polymer 2 so that contact is made between adjacent particles of the powdered semiconducting piezoelectric material to form the electrical leakage paths in the vibration-isolating article. The vibration energy is absorbed by the piezoelectric material and converted to electrical charges by the piezoelectric effect of the semiconducting piezoelectric material 1, and the electrical charges produced are in turn converted to heat energy while passing though the electrical leakage paths.

Figure 4:
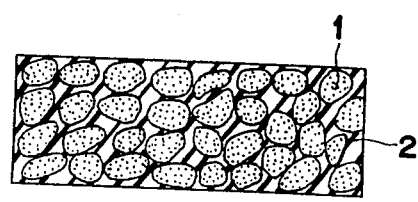

A vibration-isolating article of FIG. 4 is composed of a composite material consisting essentially of a powdered piezoelectric material 1 and a semiconducting high polymer 2. Since the powdered piezoelectric material is dispersed in the matrix of the semiconducting high polymer, electrical charges produced can flow through the matrix to the exterior of the vibration-isolating article.

In any of the vibration-isolating articles shown in FIGS. 1 to 4, the vibration energy applied to the vibration-isolating article is converted electrical charges by the piezoelectric effect, and the generated electrical charges flow through the electrical paths therein and are converted into heat energy while flowing through the electrical leakage paths. Thus, the vibration energy is finally consumed as heat, thus making it possible to improve the logarithmic decrement. Also, the vibration-isolating article according to the present invention comprises a powdered piezoelectric material dispersed in the matrix of the high polymer, so that variations of the mixing ratio of piezoelectric material to the high polymer make it possible to obtain vibration-isolating articles having desired properties required for particular uses. Accordingly, the present invention makes it possible to obtain vibration-isolating articles having a large mass, a large elastic module and a logarithmic decrement.

EXAMPLE 1

A vibration-isolating plate composed of a composite material was prepared in the following manner. A mixture was prepared by mixing, by weight, 84% of lead zirconate-titanate (PZT) powder, 1% of carbon powder and 15 % of unsaturated polyester resin (Polylite #TC102, trademark of Dainippon Ink and Chemicals, Inc.). The PZT powder comprises a main component consisting essentially of 48 mole % of $PbTiO_3$ and 52 mole % of $PbZrO_3$, and an additive of $Nb_2O_5$ in an amount of 1% by weight with respect to 100 parts by weight of the main component. The resultant mixture was added with 1% by weight of a polymerizing agent (dibenzoyl peroxide). After degassing, the mixture was formed into square plates of 10 cm×10 cm×0.5 cm. The plates were heated to 100° C. and maintained at that temperature for 2 hours to perform polymerization with crosslinking of the polyester resin.

Thus prepared specimen of the vibration-isolating plate was subjected to measurements of physical properties. The results were as follows:
  Specific gravity: 4.08
  Elastic module: 1000 Kgf/mm$^2$.
  Logarithmic decrement: 0.2.
The specimen was also subjected to measurement of a change of the acceleration of vibration to determine its vibration-isolating property. The change of the acceleration of vibration was determined at the corner of the specimen when an impact was applied to the center of the specimen by a steel ball of 2 g falling from a level 20 cm high. The result is shown in FIG. 5.

COMPARATIVE EXAMPLE

Using high carbon flake graphite cast iron, there were prepared vibration-isolating plates having the same dimensions as that in Example 1. The physical properties of the vibration-isolating plate were as follows:
  Specific gravity: 7.1
  Elastic module: 13000 Kgf/mm$^2$
  Logarithmic decrement of 0.0007.
A change of the acceleration of vibration was determined in the same manner as in Example 1. Result is shown in FIG. 6.

Figure 5:
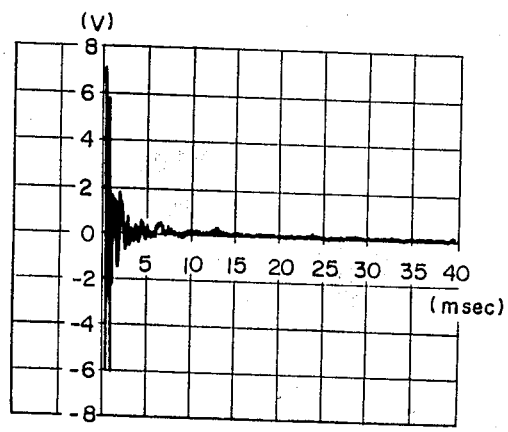
FIGS. 5 to 9 are graphs showing vibration-damping characteristics for the various vibration-isolating articles according to the present invention and the prior art.
Figure 6:
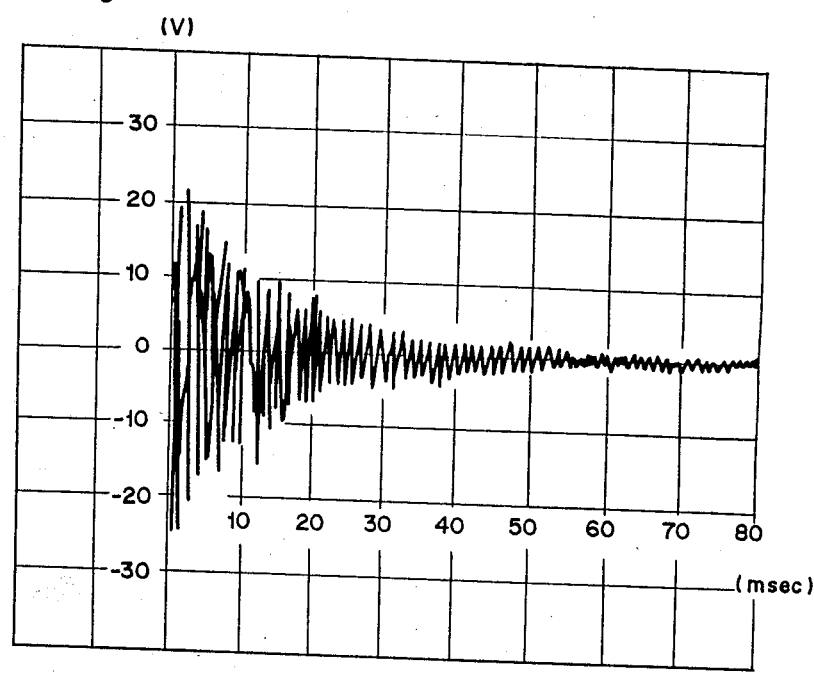

As can be seen from comparison of the results shown in FIGS. 5 and 6, the vibration-isolating plate of the present invention provides a sharp underdamping of vibration as compared with the comparative example. Also, since the vibration-isolating plate of the present invention is large in density, elastic module and logarithmic decrement, it can be said that the vibration-isolating article of the present invention fully satisfy the requirements as mentioned above.

EXAMPLE 2

Figure 7:
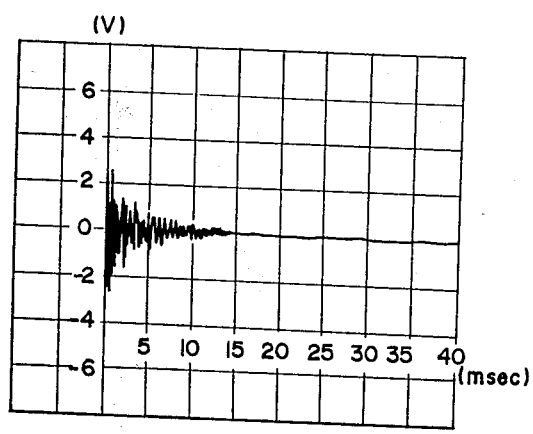

Using a mixture of 84% by weight of $BaTiO_3$ powder, 1% by weight of carbon powder and 15% by weight of unsaturated polyester resin (polylite #TC102), there were prepared vibration-isolating plates of a composite material in a form of a plate in the same manner as disclosed in Example 1. The physical properties of the vibration-isolating plate was as follows:
  Specific gravity: 9.94
  Elastic module: 1810 kgf/mm$^2$
  Logarithmic decrement: 0.1
The specimen was subjected to measurement of a change of the acceleration of vibration to determine its vibration-isolating property. The measurement was carried out in the same manner as in Example 1. The result is shown in FIG. 7.

EXAMPLE 3

Figure 8:
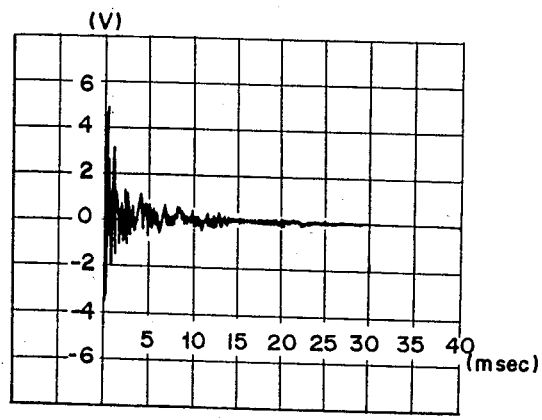

Particles of a powdered $BaTiO_3$ were immersed in an electroless plating bath containing nickel to form electrically-conductive coatings of nickel on their surfaces. The thus prepared nickel-coated $BaTiO_3$ powder (88% by weight) was mixed with 12% by weight of unsaturated polyester resin (polylite #TC102). The resultant mixture was degassed and then formed into square plates of 10 cm×10 cm×0.5 cm. The square plates were heated at 100 ° C. for 2 hours to produce vibration-isolating plates composed of a composite material, by completing the polymerization with crosslinking. The resultant specimen was subjected to measurement of physical properties. The results were as follows:
  Specific gravity: 8.85
  Elastic module: 1800 kgf/mm$^2$
  Logarithmic decrement: 0.15
The specimen was also subjected to measurement of a change of the acceleration of vibration to determine its vibration-isolating property. The measurement was carried out in the same manner as in Example 1. The result is shown in FIG. 8.

EXAMPLE 4

Figure 9:
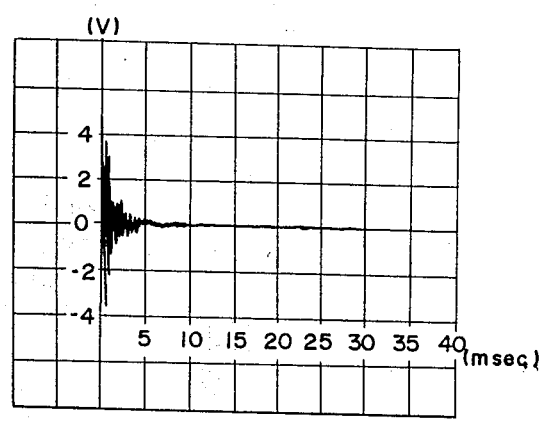

There was prepared a mixture composed of 88% by weight of semiconducting agent(yttrium)-doped $BaTiO_3$ powder and 12% by weight of unsaturated polyester resin(polylite #TC102). The resultant mixture was degassed and then formed into a square plate of 10 cm×10 cm×0.5 cm. The square plate was heated at 100° C. for 2 hours to produce a specimen of a vibration-isolating composite article by polymerization with crosslinking. The specimen was subjected to the measurement of physical properties. The results were as follows:
  Specific gravity: 9.90
  Elastic module: 1800 kgf/mm$^2$
  Logarithmic decrement: 0.16
The specimen was also subjected to measurement of a change of the acceleration of vibration to determine its vibration-isolating property. The measurement was carried out in the same manner as in Example 1. The result is shown in FIG. 9.

As will be seen from the results, the vibration-isolating plates according to the present invention have a large mass (specific gravity), a large logarithmic decrement and a large elastic module. Particularly, the vibration-isolating plates of the present invention is much superior in the logarithmic decrement to the conventionally used vibration-isolating plates of cast iron.

What we claim is:

1. A vibration-isolating article composed of a composite material comprising 60-99% of a powdered piezoelectric material and 1-40% of a high polymer, said composite material having electrical leakage paths, wherein said electrical leakage paths are formed by 0.1-10% powdered electrically conductive material dispersed in a matrix of the high polymer so that contact is made between adjacent particles of the powdered piezoelectric material and the powdered electrically conductive material.

2. A vibration-isolating article according to claim 1 comprising lead zirconate titanate powder, carbon powder and unsaturated polyester.

3. A vibration-isolating article according to claim 1 comprising barium titanate powder, carbon powder and unsaturated polyester.

4. A vibration-isolating article composed of a composite material comprising 60-99% of a powdered piezoelectric material and 1-40% of a high polymer, said composite material having electrical leakage paths, whrein said electrical leakage paths are formed by electrically conductive coatings formed on particle surfaces of the powdered piezoelectric material.

5. A vibration-isolating article according to claim 4 comprising barium titanate powder and unsaturated polyester.

* * * * *